United States Patent
Hsueh et al.

(10) Patent No.: US 9,276,203 B2
(45) Date of Patent: Mar. 1, 2016

(54) RESISTIVE SWITCHING LAYERS INCLUDING HF-AL-O

(71) Applicants: Intermolecular Inc., San Jose, CA (US); Kabushiki Kaisha Toshiba, Tokyo (JP); SanDisk 3D LLC, Milpitas, CA (US)

(72) Inventors: Chien-Lan Hsueh, Campbell, CA (US); Randall J. Higuchi, San Jose, CA (US); Tim Minvielle, San Jose, CA (US); Jinhong Tong, Santa Clara, CA (US); Yun Wang, San Jose, CA (US); Takeshi Yamaguchi, Kanagawa (JP)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 100 days.

(21) Appl. No.: 13/721,406

(22) Filed: Dec. 20, 2012

(65) Prior Publication Data
US 2014/0175361 A1    Jun. 26, 2014

(51) Int. Cl.
| | |
|---|---|
| H01L 29/00 | (2006.01) |
| H01L 47/00 | (2006.01) |
| H01L 29/02 | (2006.01) |
| H01L 29/04 | (2006.01) |
| H01L 29/06 | (2006.01) |
| H01L 47/02 | (2006.01) |
| H01L 45/00 | (2006.01) |
| H01L 27/24 | (2006.01) |

(52) U.S. Cl.
CPC ............ *H01L 45/08* (2013.01); *H01L 45/1233* (2013.01); *H01L 45/146* (2013.01); *H01L 45/1616* (2013.01); *H01L 27/2463* (2013.01)

(58) Field of Classification Search
None
See application file for complete search history.

(56) References Cited

U.S. PATENT DOCUMENTS

| | | | |
|---|---|---|---|
| 7,241,673 B2 | 7/2007 | Ahn | |
| 2004/0198069 A1* | 10/2004 | Metzner et al. | 438/785 |
| 2006/0289895 A1* | 12/2006 | Kamata | 257/192 |
| 2008/0316809 A1* | 12/2008 | Herner | 365/175 |
| 2009/0272962 A1* | 11/2009 | Kumar et al. | 257/4 |

(Continued)

OTHER PUBLICATIONS

Lee et al.; HfOx Biploar Resistive Memory with Robust Endurance Using AlCu as Buffer Electrode; Jul. 1, 2009; Industrial Technology Research Institute; IEEE Electron Device Letters vol. 30 No. 7 pp. 703705.

(Continued)

*Primary Examiner* — Mohammad Islam
*Assistant Examiner* — Jay C Chang (57) ABSTRACT

Provided are resistive random access memory (ReRAM) cells having switching layers that include hafnium, aluminum, oxygen, and nitrogen. The composition of such layers is designed to achieve desirable performance characteristics, such as low current leakage as well as low and consistent switching currents. In some embodiments, the concentration of nitrogen in a switching layer is between about 1 and 20 atomic percent or, more specifically, between about 2 and 5 atomic percent. Addition of nitrogen helps to control concentration and distribution of defects in the switching layer. Also, nitrogen as well as a combination of two metals helps with maintaining this layer in an amorphous state. Excessive amounts of nitrogen reduce defects in the layer such that switching characteristics may be completely lost. The switching layer may be deposited using various techniques, such as sputtering or atomic layer deposition (ALD).

20 Claims, 6 Drawing Sheets

(56) References Cited

U.S. PATENT DOCUMENTS

2011/0297927 A1* 12/2011 Ramaswamy et al. .......... 257/43
2013/0034947 A1* 2/2013 Hong et al. .................... 438/384
2013/0200323 A1* 8/2013 Pham et al. ....................... 257/4

OTHER PUBLICATIONS

Lee et al.; Resistance Switching Behaviors of Hafnium Oxide Films Grown by MOCVD for Nonvolatile Memory Applications; Dec. 6, 2007; Pohang Institute of Science and Technology. Korea; Journal of the Electrochemical Society Dec. 6, 2007 pp. H92H96 vol. 155 2.
Toriumi et al; Doped HfO2 for Higherk Dielectrics; Jan. 1, 2005; University of Tokyo; 208th ECS Meeting Abstract #508.
Chan et al.; Resistive switching effects of HfO2 highk dielectric; Sep. 25, 2008; Chartered Semiconductor Manufacturing Ltd.; Microelectronic Engineering pp. 24202424 vol. 85.
Chen, P., et al.; HfOx Thin Films for Resistive Memory Device by Use of Atomic Layer Deposition; Jan. 1, 2007; Industrial Technology Research Institute; Mater. Res. Soc. Symp. Proc. vol. 997 2007 Materials Research Society.
Chen, Y.S., et al.; Highly Scalable Hafnium Oxide Memory with Improvements of Resistive Distribution and Read Disturb Immunity; Jan. 1, 2009; Industrial Technology Research Institute; pp. IEDM09108.
Lee, J., et al.; DiodeLess NanoScale ZrOxHfOx RRAM Device with Excellent Switching Uniformity and Reliability for HighDensity CrossPoint Memory Application; Jan. 1, 2010; Academia-Gwangju Institute of Science and Technology (Gwangju, KR); pp. 19.5.119.5.4.
Xiong, K., et al.; Passivation of Oxygen Vacancy States in HfO2 by Nitroggen; Jan. 1, 2006; Cambridge University; Journal of Applied Physics pp. 99101.
Choi, K., et al.; Initial Growth of Interfacial Oxide During Deposition of HfO2 on Silicon; Jul. 12, 2004; Texas Tech University; Applied Physics Letters vol. 85 No. 2 pp. 215218.
Fillot, F. et al.; Investigations of the Interface Stability in HfO2Metal Electrodes; Jan. 1, 2003; STM-AMAT; Microelectronic Engineering pp. 384391.
Yu, S., et al.; Improved Uniformity of Resistive Switching Behaviors in HfO2 Thin Films with Embedded Al Layers; Jan. 1, 2010; CNSE; Electochemical and SolidState Letters H36H38.
Chang, K., et al.; Investigation on the Abnormal Resistive Switching Induced by Ultraviolet Light Exposure Bsaed on HfOx Film; Jan. 1, 20101; Z-Book-Elsevier; Microelectronics Reliability pp. 19311934.
Schmidt, B., et al.; Carbon Incorporation in Chemical Vapor Deposited Aluminum Oxide Films; Jan. 1, 2010; Z-Book-Elsevier; Thin Solid Films pp. 36583663.
Sivasubramani, P., et al.; Effect of Composition on the Thermal Stability of Sputter Deposited Hafnium Aluminate and Nitrided Hafnium Aluminate Dielectrics on Si 100; Jan. 1, 2007; American Institute of Physics; Journal of Applied Physics pp. 11410811141086.
Yu, D., et al.; Lanthanide and IrBased Dual MetalGateHfAlON CMOS with Large WorkFunction Difference; Jan. 1, 2005; IEEE; 4 pages.
Doh, S., et al.; Improvement of NBTI and Electrical Characteristics by Ozone PreTreatment and PBTI Issues in HfAlON Highk Gate Dielectrics; Jan. 1, 2003; IEEE; 38.7.1 38.7.4.
Park, S., et al.; Performance Improvement of MOSFET with HfO2Al2O3 Laminate Gate Dielectric and CVDTaN Metal Gate Deposited by TAIMATA; Jan. 1, 2003; IEEE; pp. 13.6.113.6.4.
Yu, X., et al.; The Role of Nitrogen on ChargeTrappingInduced Vth Instabillity in HfAlON Highk Gate Dielectric with Metal and PolySi Gate Electrodes; Aug. 1, 2007; IEEE; IEEE Transactions on Electron Devices vol. 54 No. 8 pp. 19721977.

* cited by examiner

FIG. 6B

DETAILED DESCRIPTION

A detailed description of various embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Introduction

A ReRAM cell exhibiting resistive switching characteristics generally includes multiple layers formed into a stack. This stack is sometimes referred to as a Metal-Insulator-Metal (MIM) stack. The stack includes two conductive layers operating as electrodes. These conductive layers are identified as "M" and may include metals and other conductive materials, such as doped silicon. The stack also includes an insulator layer provided in between the electrode and is indentified as "I". The insulator layer exhibits changes in its resistive properties characterized by applying predetermined voltages. These resistive states may be used to represent one or more bits of information. As such, the insulator layer is often referred to as a resistive switching layer and the overall ReRAM cell may be referred to as resistive random access memory (ReRAM) cell.

It has been found that certain materials exhibit resistive switching characteristics and, thus, may be suitable materials for resistive switching layers in ReRAM cells. Generally, these materials have some forms of defects that allow them to switch. For example, metal oxides may be formed with some oxygen vacancies that increase conductivity of these oxides. The oxygen vacancies may be created by oxygen removal from stoichiometric oxides, doping, and other techniques further described below. These defects are believed to form conductive paths or filaments during initial activation of the resistive switching layers by applying a forming voltage. The filaments can be broken and reformed during switching to provide different resistive stated of the ReRAM cells thereby allowing to store data in these cells.

Practical applications of ReRAM cells require certain switching, data retention, and other characteristics. For example, ReRAM cells need to have low leakage, low switching currents, stable performance over a large number of switching cycles. More specific examples of these characteristics are described below with reference to FIGS. 1A-1B and 2. It has been found that a composition and morphology of resistive switching layers has to be specifically tuned to meet these requirements. For example, hafnium and aluminum oxides may have poor switching characteristics when used independently, i.e., a switching layer including non-stoichiometric hafnium oxide or a switching layer including non-stoichiometric aluminum oxide. Combining hafnium and aluminum oxides in the same resistive switching layer improves some of the switching characteristics. Without being restricted to any particular theory, it is believed that a combination of hafnium and aluminum oxides may help to improve these switching characteristics (e.g., by distorting lattices and/or forming oxygen vacancies).

It has been found that some switching characteristics can be further improved by introducing nitrogen into oxides (or introducing oxygen into nitrides). This switching behavior was unexpected. For example, addition of nitrogen helps to maintain the resistive switching layers in an amorphous state thereby improving their long term performance. Furthermore, addition of some nitrogen reduces the set and reset currents through the layers, which in turn reduces power consumption, reduces heating, and also improves long term performance characteristics. Without being restricted to any particular theory, it is believed that addition of nitrogen effectively controls the amount of oxygen vacancies and fewer conductive filaments are formed as a result of this addition. However, switching layers with excessive amounts of nitrogen have shown poor resistive switching characteristics. It is believed that substantial reduction of oxygen vacancies reduces the ability of these films to form conductive filaments.

Provided are ReRAM cells having switching layers that include hafnium, aluminum, oxygen, and nitrogen. This combination of four elements is not limited to any particular stoichiometric relationship or formula. The composition of switching layers is specifically designed to achieve desirable performance characteristics of ReRAM cells. In some embodiments, a switching voltage is less than about 2 V, while the corresponding switching current is less than about 100 µA, which provides improved (lower) power characteristics.

In some embodiments, the concentration of nitrogen in the switching layer is between about 1 and 20 atomic percent or, more specifically, between about 2 and 5 atomic percent. The nitrogen concentration may be at least three times less than the oxygen concentration in the same layer. In some embodiments, the concentration of oxygen in the resistive switching layer is between about 30 and 60 atomic percent or, more specifically between about 40 and 50 atomic percent. As stated above, addition of nitrogen may be used for controlling the amount of oxygen vacancies in the layer and for maintaining this layer in an amorphous state. Furthermore, addition of aluminum into the layer also helps to reduce its crystallization during annealing and/or switching.

In some embodiments, the concentration of hafnium in the resistive switching layer is between about 5 and 40 atomic percent or, more specifically, between about 10 and 30 atomic percent. The concentration of aluminum in the same layer may be between 3 and 20 atomic percent or, more specifically, between about 5 and 10 atomic percent. In some embodiments, the hafnium concentration is at least twice greater than the aluminum concentration.

The fabrication process may include formation of a base layer, which may be deficient in oxygen and/or nitrogen. The deficient element is added to convert the base layer into a resistive switching layer. For example, a base layer may include hafnium and aluminum oxides and substantially no nitrogen. Nitrogen is then added during a later nitriding operation. In a similar manner, a base layer may include hafnium and aluminum nitrides and substantially no or an insufficient amount of oxygen. Oxygen is then added during a later oxygenation operation. Alternatively, the base layer may be formed with all necessary components and no separate nitriding or oxygenation operations may be needed. In this case, the base layer is formed already as a resistive switching layer.

A base layer may be deposited using various techniques, such as sputtering and atomic layer deposition (ALD). The ALD approaches may be further divided into nanolamination ALD or staggered pulse ALD. The following description of these approaches is directed to initial formation of metal oxides followed by nitriding operations. However, one having ordinary skills in the art would understand that such processes may also involve initial formation of metal nitrides followed by oxygenation operations.

Nanolamination may involve deposition of one or more hafnium oxide layers and, separately, one or more aluminum oxide layers to form a stack. The stack is then annealed in order to intermix these layers. In some embodiments, the resulting layer (i.e., after the annealing) is substantially homogeneous. For example, a hafnium containing precursor, such as TDMAHf, TEMAHf, and/or hafnium tetrachloride may be introduced into an ALD chamber followed by an oxidizer, such as water or ozone. A hafnium oxide layer may be formed at this point. This hafnium precursor—oxidizer cycle may be repeated multiple times depending on a desired concentration of hafnium in a resulting base layer (and subsequently in the resistive switching layer). An aluminum containing precursor, such as a TMA, is then introduced into a chamber, followed by introduction of an oxidizer, such as water or ozone. As such, a separate layer of aluminum oxide is formed over one or more layers of hafnium oxide. Of course, this deposition order may be reversed, and one or more aluminum oxide layers may be deposited prior to deposition of one or more hafnium oxide layers. Furthermore, deposition of one or more aluminum oxides layers and one or more hafnium oxide layers may be repeated a number of times until the base layer becomes sufficiently thick. The composition of the base layer can be modified by controlling how many aluminum oxides layers and how many hafnium oxides layers are deposited and form the base layer. For example, a base layer may be formed by alternating depositions of five hafnium oxide layers per one aluminum oxide layer. Furthermore, distribution of hafnium, aluminum, oxygen, and nitrogen in the resulting resistive switching layer may be controlled by specific order of ALD cycles.

A staggered pulse deposition may involve introducing a hafnium containing precursor into an ALD chamber followed by introducing an aluminum containing precursor into the ALD chamber. It should be noted that both metal precursors are introduced into the chamber prior to any oxidation of any one of the two precursors. In some embodiments, an aluminum containing precursor is introduced into the chamber prior to introducing a hafnium containing precursor. This order depends on the type of metal precursors (their adsorption characteristics, size, reactivity, and other like characteristics) and desired composition of the resulting base layer. For example, if TMA is introduced into the chamber prior to TDMAHf, then the resulting base layer contains predominantly aluminum oxide with very little hafnium present. However, if TMAHf is introduced into the chamber prior to TDMA, then the resulting base layer contains about 30 atomic percent of aluminum oxide and 70 atomic percent of hafnium oxide relative to the total amount of metals present in the layer. In some embodiments, concentration of hafnium relative to the total amount of metal (i.e., Hf/(Hf+Al)) ranges from 40 to 70 atomic percent.

Once both metal precursors are allowed to adsorb on the surface, an oxidizer is introduced into the chamber to convert both precursors into corresponding oxides or nitrides. As such, a film containing both aluminum and hafnium oxides (or nitrides) may be formed. This cycle including introduction of two metal precursors followed by introduction of an oxidizer may be repeated a number of times to build a base layer having a desired thickness. The base layer composition generally depends on the nature of precursors used in this approach.

Once the base layer is formed, the process may continue with introducing nitrogen (or oxygen) into this layer to convert the layer into a resistive switching layer. Various nitridation techniques may be used, such as plasma nitridation (e.g., de-coupled plasma nitridation) and thermal nitridation treatment (e.g., anneal). In some embodiments, some or all of the nitrogen may be introduced into the base layer during its formation. For example, ammonia may be used an as a reactant during ALD processing to convert one or more metal containing precursors into nitride layers that are provided in the same stack with the oxide layer. If all nitrogen is introduced during formation of the base layer, then no separate nitridation step is needed after formation of the base layer. In other words, the base layer is already formed as a resistive switching layer.

Examples of ReRAM Cells and their Switching Mechanisms

A brief description of ReRAM cells is provided for better understanding of various features of resistive switching layers described in this document. A ReRAM cell includes a resistive switching layer formed from a dielectric material exhibiting resistive switching characteristics. A dielectric, which is normally insulating, can be made to conduct through one or more filaments or conduction paths formed after application of a sufficiently high voltage. The conduction path formation can arise from different mechanisms, including defects, metal migration, and other mechanisms further described below. Once the one or more filaments or conduction paths are formed in the dielectric component of a memory device, these filaments or conduction paths may be reset (or broken resulting in a high resistance) or set (or re-formed resulting in a lower resistance) by applying certain voltages.

Figure 1A:
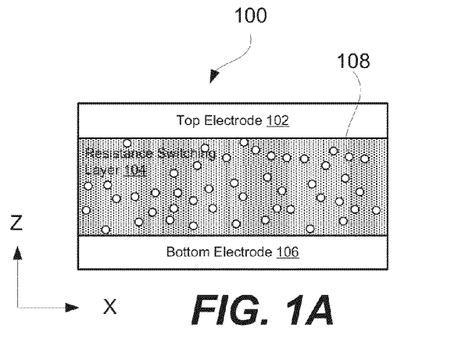

FIG. 1A illustrates a schematic representation of ReRAM cell 100 including top electrode 102, bottom electrode 106, and resistive switching layer 104 provided in between top electrode 102 and bottom electrode 106. It should be noted that the "top" and "bottom" references for electrodes 102 and 106 are used solely for differentiation and not to imply any particular spatial orientation of these electrodes. Often other references, such as "first formed" and "second formed" electrodes or simply "first" and "second", may be used identify and distinguish the two electrodes. ReRAM cell 100 may also include other components, such as current limiting layers, diodes, and other components.

Resistive switching layer 104 may be initially formed from a dielectric material. It later can be made to conduct through one or more filaments or conduction paths formed by applying first a forming voltage (after initial fabrication) and later a set voltage (during operation). To provide this resistive switching functionality, resistive switching layer 104 includes a concentration of electrically active defects 108, which are sometimes referred to as traps. For example, some charge carriers may be absent from the structure (i.e., vacancies) and/or additional charge carriers may be present (i.e., interstitials) representing defects 108. In some embodiments, defects may be formed by impurities (i.e., substitutions). These defects may be utilized for ReRAM cells operating according to a valence change mechanism, which may occur in specific transition metal oxides and is triggered by a migration of anions, such as oxygen anions. Migrations of oxygen anions may be represented by the motion of the corresponding vacancies, i.e., oxygen vacancies. A subsequent change of the stoichiometry in the transition metal oxides leads to a redox reaction expressed by a valence change of the cation sublattice and a change in the electrical conductivity. In this example, the polarity of the pulse used to perform this change determines the direction of the change, i.e., reduction or oxidation. Other resistive switching mechanisms include bipolar electrochemical metallization mechanisms and thermochemical mechanisms, which leads to a change of the stoichiometry due to a current-induced increase of the temperature.

Figure 1B:
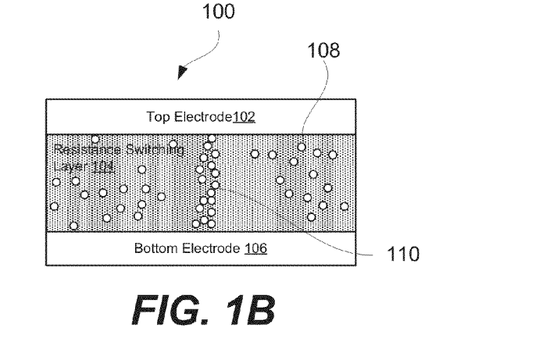

Without being restricted to any particular theory, it is believed that defects 108 can be reoriented within resistive switching layer 104 to form filaments or conduction paths as, for example, schematically shown in FIG. 1B as element 110. This reorientation of defects 108 occurs when a certain voltage is applied to electrodes 102 and 106. Sometimes, reorientation of defects 108 is referred to as "filling the traps" when a set voltage is applied (and forming one or more filaments or conduction paths) and "emptying the traps" when a reset voltage is applied (and breaking the previously formed filaments or conduction paths).

Defects 108 can be introduced into resistive switching layer 104 during or after its fabrication. For example, a concentration of oxygen deficiencies can be introduced into metal oxides during their deposition or during subsequent annealing.

Figure 2:
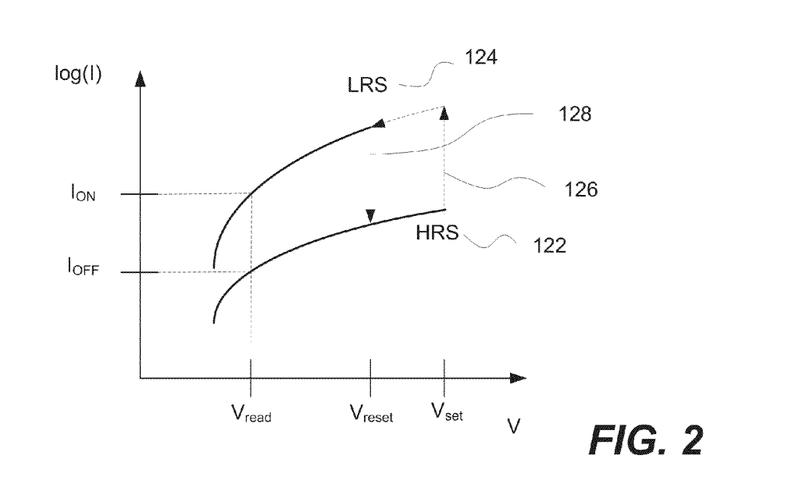

Operation of ReRAM cell 100 will now be briefly described with reference to FIG. 2 illustrating a logarithmic plot of a current passing through a unipolar ReRAM cell as a function of a voltage applied to the electrode of ReRAM cell, in accordance with some embodiments. Similar characteristics are demonstrated by unipolar cells, additional details of which are further presented below. ReRAM cell 100 may be either in a low resistive state (LRS) defined by line 124 or high resistive state (HRS) defined by line 122. Each of these states is used to represent a different logic state, e.g., HRS representing logic one and LRS representing logic zero or vice versa. Therefore, each ReRAM cell that has two resistive states may be used to store one bit of data. It should be noted that some ReRAM cells may have three and even more resistive states allowing multi-bit storage in the same cell.

HRS and LRS are defined by presence or absence of one or more filaments or conductive paths in resistive switching layer 104 and forming connections between these filaments or conduction paths and two electrodes 102 and 106. For example, a ReRAM cell may be initially fabricated in LRS and then switched to HRS. A ReRAM cell may be switched back and forth between LRS and HRS many times, defined by set and reset cycles. Furthermore, a ReRAM cell may maintain its LRS or HRS for a substantial period of time and withstand a number of read cycles.

The overall operation of ReRAM cell 100 may be divided into a read operation, set operation (i.e., turning the cell "ON"), and reset operation (i.e., turning the cell "OFF"). During the read operation, the state of ReRAM cell 100 or, more specifically, the resistive of resistive switching layer 104 can be sensed by applying a sensing voltage to electrodes 102 and 106. The sensing voltage is sometimes referred to as a "READ" voltage and indicated as $V_{READ}$ in FIG. 2. If ReRAM cell 100 is in HRS represented by line 122, the external read and write circuitry connected to electrodes 102 and 106 will sense the resulting "OFF" current ($I_{OFF}$) that flows through ReRAM cell 100. As stated above, this read operation may be performed multiple times without switching ReRAM cell 100 between HRS and LRS. In the above example, the ReRAM cell 100 should continue to output the "OFF" current ($I_{OFF}$) when the read voltage ($V_{READ}$) is applied to the electrodes.

Continuing with the above example, when it is desired to switch ReRAM cell 100 into a different logic state (corresponding to LRS), ReRAM cell 100 is switched from its HRS to LRS. This operation is referred to as a set operation. This may be accomplished by using the same read and write circuitry to apply a set voltage ($V_{SET}$) to electrodes 102 and 106. Applying the set voltage ($V_{SET}$) forms one or more filaments or conduction paths in resistive switching layer 104 and switches ReRAM cell 100 from its HRS to LRS as indicated by dashed line 126. It should be noted that formation or breaking of filaments or conduction paths in resistive switching layer 104 may also involve forming or breaking electrical connections between these filaments and one (e.g., reactive electrode) or both electrodes. The overarching concern is passage of the current between the two electrodes.

In LRS, the resistive characteristics of ReRAM cell 100 are represented by line 124. In this LRS, when the read voltage ($V_{READ}$) is applied to electrodes 102 and 106, the external read and write circuitry will sense the resulting "ON" current ($I_{ON}$) that flows through ReRAM cell 100. Again, this read operation may be performed multiple times without switching ReRAM cell 100 between LRS and HRS.

It may be desirable to switch ReRAM cell 100 into a different logic state again by switching ReRAM cell 100 from its LRS to HRS. This operation is referred to as a reset operation and should be distinguished from set operation during which ReRAM cell 100 is switched from its HRS to LRS. During the reset operation, a reset voltage ($V_{RESET}$) is applied to ReRAM cell 100 to break the previously formed filaments or conduction paths in resistive switching layer 104 and switches ReRAM cell 100 from its LRS to HRS as indicated by dashed line 128. Reading of ReRAM cell 100 in its HRS is described above. Overall, ReRAM cell 100 may be switched back and forth between its LRS and HRS many times. Read operations may be performed in each of these states (between the switching operations) one or more times or not performed at all. It should be noted that application of set and reset voltages to change resistive states of the ReRAM cell involves complex mechanisms that are believed to involve localized resistive heating as well as mobility of defects impacted by both temperature and applied potential.

ReRAM cell 100 may be configured to have either unipolar switching or bipolar switching. The unipolar switching does not depend on the polarity of the set voltage ($V_{SET}$) and reset voltage ($V_{RESET}$) applied to the electrodes 102 and 106 and, as a result, to resistive switching layer 104. In the bipolar switching the set voltage ($V_{SET}$) and reset voltage ($V_{RESET}$) applied to resistive switching layer 104 need to have different polarities.

In some embodiments, the set voltage ($V_{SET}$) is between about 100 mV and 10V or, more specifically, between about 500 mV and 5V. The length of set voltage pulses ($t_{SET}$) may be less than about 100 milliseconds or, more specifically, less than about 5 milliseconds and even less than about 100 nanoseconds. The read voltage ($V_{READ}$) may be between about 0.1 and 0.5 of the write voltage ($V_{SET}$). In some embodiments, the read currents ($I_{ON}$ and $I_{OFF}$) are greater than about 1 mA or, more specifically, is greater than about 5 mA to allow for a fast detection of the state by reasonably small sense amplifiers. The length of read voltage pulse ($t_{READ}$) may be comparable to the length of the corresponding set voltage pulse ($t_{SET}$) or may be shorter than the write voltage pulse ($t_{RESET}$).

A ratio of set and reset currents (i.e., a high $I_{SET}/I_{RESET}$ ratio) that correspond to set voltage ($V_{SET}$) and reset voltage ($V_{RESET}$) may be at least about 5 or, more specifically, at least about 10 to make the state of ReRAM cell easier to determine. ReRAM cells should be able to cycle between LRS and HRS between at least about $10^3$ times or, more specifically, at least about $10^7$ times without failure. A data retention time ($t_{RET}$) should be at least about 5 years or, more specifically, at least about 10 years at a thermal stress up to 85° C. and small electrical stress, such as a constant application of the read voltage ($V_{READ}$). Other considerations may include low current leakage, such as less than about 40 A/cm² measured at 0.5 V per 20 Å of oxide thickness in HRS.

In some embodiments, the same ReRAM cell may include two or more resistive switching layers interconnected in series. Adjacent resistive switching layers may directly interface each other or be separated by an intermediate layer.

In some embodiments, a ReRAM cell is subjected to a forming operation, during which the initially insulating properties of the resistive switching layer are altered and the ReRAM cell is configured into the initial LRS or HRS. The forming operation may include a very short high discharge current peak associated with a forming voltage, which is used to set the LRS level of the resistive switching layer for subsequent switching as outlined above. In this case, a resistive switching layer with very low levels (e.g., 100-30 kOhm) of resistance in the LRS may be limited in terms of scaling down. This difficulty may be resolved by positioning such resistive switching layers in series with other components providing additional resistance to the overall ReRAM cell.

Processing Examples

Figure 3A:
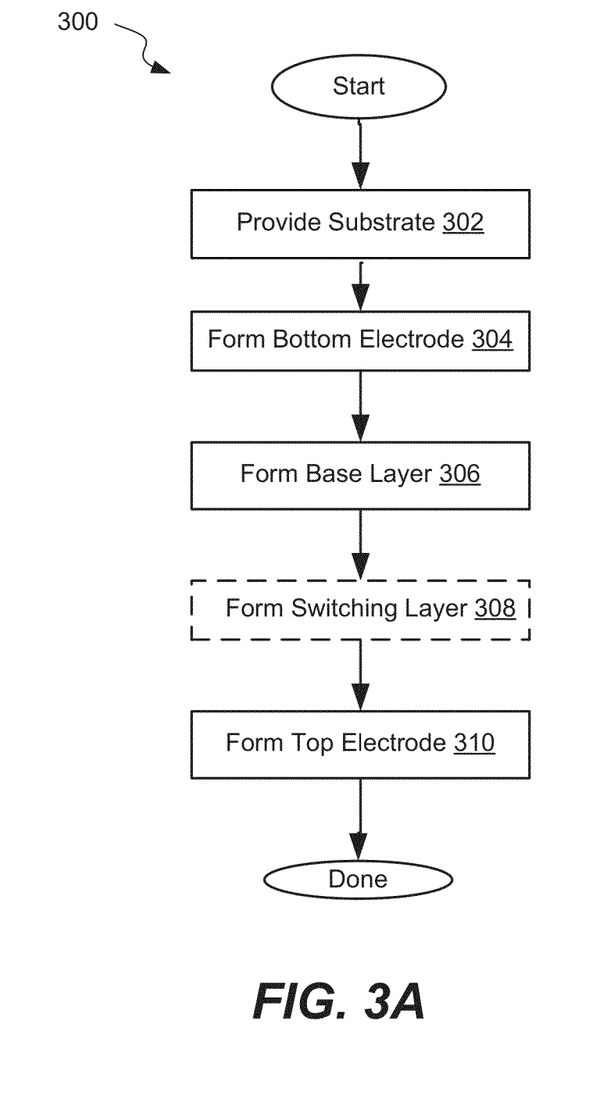
FIG. 3B further illustrates various features of the base layer formation operation, in accordance with certain embodiments.

FIG. 3A illustrates a process flowchart corresponding to method 300 of forming a ReRAM cell, in accordance with some embodiments. Method 300 may commence with providing a substrate during operation 302. The substrate is used for receiving various deposited components of the ReRAM cell. Furthermore, the same substrate often is used for receiving components of multiple ReRAM cells. For example, large memory cell arrays may be formed on the same substrate. Components of multiple ReRAM cells may be formed from the same set of initial layers formed on that substrate. The substrate provided in operation 302 may include one or more signal lines or contacts. These lines or contacts provide an electrical connection to a bottom electrode. In some embodiments, the bottom electrode formed in operation 302 serves as a signal line. In a similar manner, a top electrode formed in operation 310 may function as a signal line or it may be connected to a separate signal line.

Method 300 may proceed with forming a bottom electrode during operation 304. The bottom electrode may be formed using ALD, CVD, sputtering, or some other techniques. For example, a titanium nitride electrode may be formed using sputtering. Deposition of the titanium nitride electrode may be performed using a titanium target in a nitrogen atmosphere maintained at a pressure of between about 1-20 mTorr. The power may be maintained at 150-500 Watts that may result in a deposition rate of about 0.5-5 Angstroms per second (depending on the size of the target sample and other process parameters). Some of the provided process parameters are for illustrative purposes only and generally depend on deposited materials, tools, deposition rates, and other factors.

Method 300 may proceed with forming a base layer that includes hafnium and aluminum oxides or nitrides in operation 306. The base layer containing hafnium and aluminum oxides may be then nitridized during operation 308 to form a resistive switching layer that also includes nitrogen. In a similar manner, the base layer containing hafnium and aluminum nitrides may be then oxidized during operation 308 to form a resistive switching layer that also includes sufficient amounts of oxygen. In some embodiments, operations 306 and 308 are combined such that the initially formed base layer already includes sufficient amounts of nitrogen and oxygen and further nitriding or oxidation operations are not needed.

The base layer (or the final resistive switching layer) may be formed using reactive sputtering, ALD, or other techniques. For example, the base layer may be formed using reactive sputtering by employing a hafnium target and an aluminum target in a 20-60% oxygen atmosphere. Power of 100-1000 Watts (W) may be used to achieve deposition rates of between about 0.1 and 1.0 Angstroms per second. These process parameters are provided as examples and generally depend on deposited materials, tools, deposition rates, and other factors. Nitrogen may be added into this deposition environment to be incorporated directly into the base layer.

In some embodiments, the base layer is formed using ALD. This technique includes one or more cycles, each involving the following four steps: introducing one or more precursors into the depositing chamber to form an absorbed layer, followed by purging these precursors reactive agents, and then introducing reactive agents that will react with the absorbed layer to form a portion of or the entire base layer, followed by purging the reactive agents reactive agents. Selection of precursors and processing conditions depend on desired composition, morphology, and structure of each portion of the electrode.

A layer formed during each atomic layer deposition cycle described above may be between about 0.25 and 2 Angstroms thick. The cycle may be repeated multiple times until the overall base layer (and subsequently the thickness of the resistive switching layer) reaches it desired thickness. In some embodiments, the thickness of the resistive switching layer is less than 50 Angstroms or, more specifically, less than 30 Angstroms. In general, the thickness of the resistive switching layer is at least about 10 Angstroms or, more specifically, at least about 20 Angstroms, as thin films may be considered too "leaky." In some embodiments, ALD cycles are repeated using different precursors. As such, different portions of the same base layer may have different compositions as will be later described with reference to FIG. 3B.

ALD techniques are now briefly described to provide better understanding of various processing features. A hafnium containing precursor or an aluminum containing precursor is introduced into the ALD chamber and allowed to flow over the deposition surface (which may have previously deposited ALD layers) provided therein. The one or more precursors are introduced in the form of pulses. Between the pulses, the reaction chamber is purged, for example, with an inert gas to remove unreacted precursors, reaction products, and other undesirable components from the chamber.

The introduced precursor adsorbs (e.g., saturatively chemisorbs) on the deposition surface. Subsequent pulsing with a purging gas removes excess precursor from the deposition chamber. In some embodiments, purging is performed before full saturation of the substrate surface occurs with the precursors. In other words, additional precursor molecules could have been further adsorbed on the substrate surface if the purging was not initiated so early. Without being restricted to any particular theory, it is believed that partial saturation can be used to introduce defects into the formed layer, e.g., during forming of a resistive switching layer.

After the initial precursor pulsing and purging of one or more metal containing precursors, a subsequent pulse introduces a reactant agent. The reactant agent reacts with the adsorbed metal containing molecules to form oxides and/or nitrides. Reaction byproducts and excess reactants are purged from the deposition chamber. The saturation during the reaction and purging stages makes the growth self-limiting. This feature helps to improve deposition uniformity and conformality and allows more precise control of the resulting resistive switching characteristics.

The temperature of the substrate during atomic layer deposition may be between about 200° C. to 350° C. The precursor may be either in gaseous phase, liquid phase, or solid phase. If a liquid or solid precursor is used, then it may be transported into the chamber an inert carrier gas, such as helium or nitrogen.

Some examples of hafnium containing precursors include bis(tert-butylcyclopentadienyl) dimethyl hafnium ($C_{20}H_{32}Hf$), bis(methyl-η5-cyclopentadienyl) methoxymethyl hafnium ($HfCH_3(OCH_3)[C_5H_4(CH_3)]_2$), bis(trimethylsilyl)amido hafnium chloride ($[[(CH_3)_3Si]_2N]_2HfCl_2$), dimethylbis(cyclopentadienyl)hafnium ($(C_5H_5)_2Hf(CH_3)_2$), hafnium isopropoxide isopropanol adduct ($C_{12}H_{28}HfO_4$), tetrakis(diethylamido)hafnium ($[(CH_2CH_3)_2N]_4Hf$)—also known as TEMAH, tetrakis(ethylmethylamido)hafnium ($[(CH_3)(C_2H_5)N]_4Hf$), tetrakis(dimethylamido) hafnium ($[(CH_3)_2N]_4Hf$)—also known as TDMAH, and hafnium tert-butoxide (HTB). Some hafnium containing precursors can be represented with a formula (RR'N) 4Hf, where R and R' are independent hydrogen or alkyl groups and may be the same or different. Some examples of aluminum containing precursors include aluminum tris (2,2,6,6-tetramethyl-3,5-heptanedionate) ($Al(OCC(CH_3)_3CHCOC(CH_3)_3)_3$), triisobutyl aluminum ($[(CH_3)_2CHCH_2]_3Al$), trimethyl aluminum ($(CH_3)_3Al$)—also known as TMA, Tris(dimethyl amido) aluminum ($Al(N(CH_3)_2)_3$). The nitrogen containing oxidizing agent may include ammonia ($NH_3$), which in some embodiments may be mixed with carbon monoxide (CO). Some examples of suitable oxidizing agents containing oxygen include water (H2O), peroxides (organic and inorganic, including hydrogen peroxide $H_2O_2$), oxygen ($O_2$), ozone ($O_3$), oxides of nitrogen (NO, $N_2O$, $NO_2$, $N_2O_5$), alcohols (e.g., ROH, where R is a methyl, ethyl, propyl, isopropyl, butyl, secondary butyl, or tertiary butyl group, or other suitable alkyl group), carboxylic acids (RCOOH, where R is any suitable alkyl group as above), and radical oxygen compounds (eg., O, $O_2$, $O_3$, and OH radicals produced by heat, hot-wires, and/or plasma).

Figure 3B:
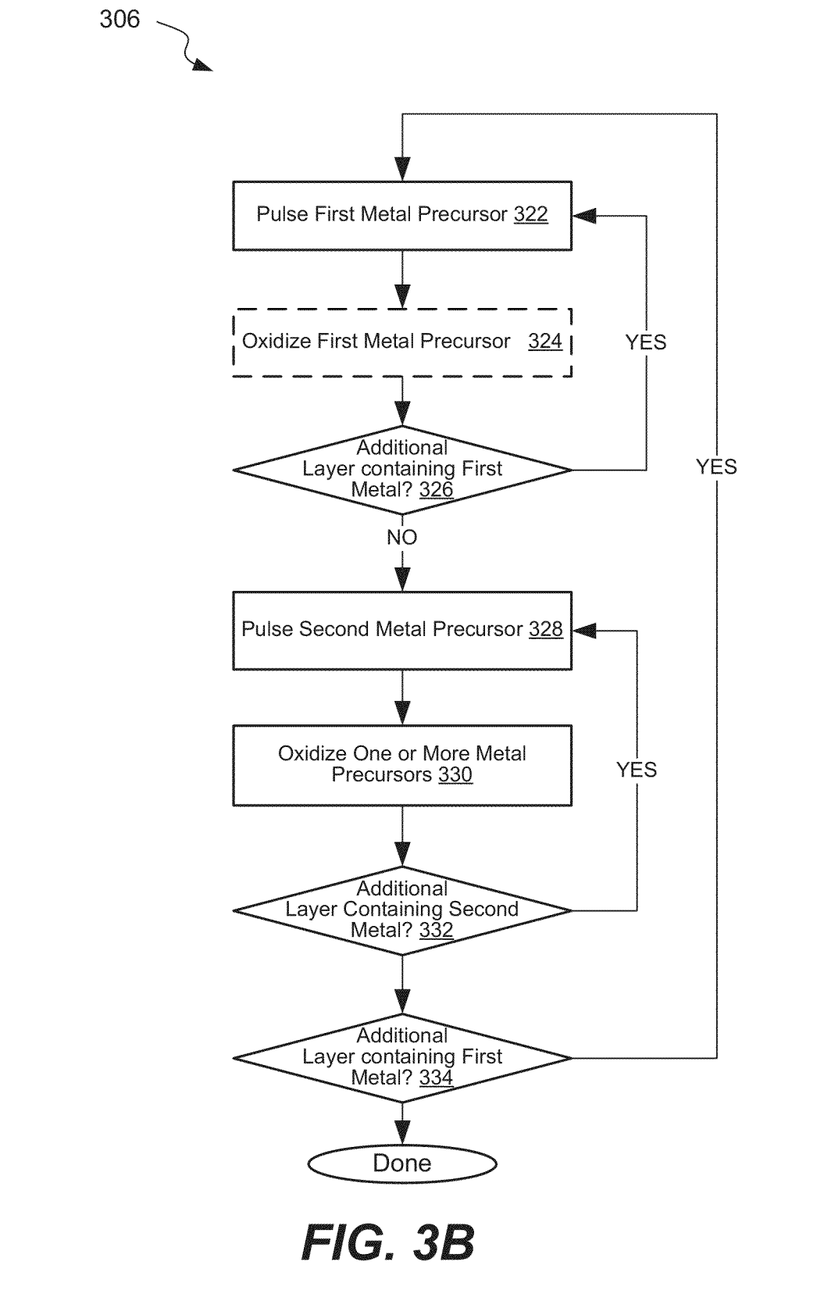

Different examples of operation 306 will now be explained with reference to FIG. 3B. Operation 306 may start with pulsing of a first metal containing precursor into the ALD chamber during sub-operation 322. The first metal containing precursor may include hafnium or aluminum. For example, the hafnium containing precursor is introduced to the chamber as a pulse. A purge gas may be provided continuously with the pulse or may be discontinued during the pulse. The purge gas is non-reactive or inert at given process conditions and may include nitrogen ($N_2$) or helium (He). At least a portion of the precursor adsorbs onto or reacts with the surface of the bottom electrode. Adsorption of the precursor depends on the availability of adsorption sites. When these sites are all consumed (i.e., a fully saturated processing layer is formed), no more metal containing precursor can adsorb, and any remaining precursor is removed by flowing the purge gas.

Once the first metal containing precursor is adsorbed on the deposition surface and remaining portions of the precursor are purged from the chamber, operation 306 may proceed with reaction of the adsorbed precursor during optional sub-operation 324. In this sub-operation, a pulse of a reactant agent is provided to the deposition chamber. The reactant agent reacts with the metal containing precursor remaining on the substrate and forms a metal oxide film or a metal nitride firm. The reactant agent is then purged from the deposition chamber. This cycle may be repeated until the desired thickness of first metal oxide (or nitride) is formed as reflected by decision block 326. In some embodiments, reactant agents are changed from one cycle to another to form both metal oxide films and metal nitride films in the stack. The distribution of nitrogen in the stack may be uneven as further described below with reference to FIG. 4. For example, most of the nitrogen may be concentrated near one surface of the stack. As such, initial or final reaction sub-operations may include more reaction operations involving nitrogen containing reactant agents than other reaction sub-operations.

The process then continues with pulsing of a second metal precursor into the chamber during sub-operation 328. This precursor contains a different metal than the first metal containing precursor used in sub-operation 322. For example, if a hafnium containing precursor was used in sub-operation 322, then an aluminum containing precursor will be used in used in sub-operation 328. The second metal containing precursor is then oxidized to form a metal oxide containing the second metal during sub-operation 330. This cycle may be repeated until the desired thickness of a built up stack is formed as reflected by decision block 332. A number of cycles depositing the first metal oxide and a number of cycles depositing the second metal oxide are controlled to achieve a specific composition of the base layer. The following table provides experimental results indicating different concentrations of metals in the base layers caused by process variations.

TABLE

| Number of Hf layers:Number of Al layers | Concentration of Hf/(Hf + Al) in a resulting nano-laminate layer, atomic % |
|---|---|
| 1:1 | ~30-40% |
| 1:3 | ~20-30% |
| 1:5 | ~10-20% |

The overall process of depositing oxides and/or nitrides of the first and second metals may be repeated a number of times until the overall base layer reach a predetermined thickness as reflected by the decision block 334. This approach is referred to as nanolamination ALD, in which multiple layers of different metal oxides form a stack.

In an alternative approach, which is referred to as staggered pulse ALD, sub-operation 324 is skipped and process continues with pulsing of a second metal containing precursor into the ALD chamber during operation 328. In this approach, the two metal containing precursors are adsorbed on the deposition surface prior to reaction. A reactant agent is then introduced into the chamber during operation 330 to convert both precursors into two corresponding metal nitrides or oxides. The order of adsorption and reactivity of the two precursors determine the composition of the resulting base layer. For example, if TMA is introduced into the chamber prior to TDMAHf, then resulting base layer contains predominantly aluminum oxide with very little hafnium present. However, if TMAHf is introduced into the chamber prior to TDMA, then resulting base layer contains about 70 atomic percent of hafnium relative to the total metal amount in the resulting layer. In some embodiments, both nanolamination ALD and staggered pulse ALD approaches may be used to form the same base layer.

Returning to FIG. 3A, after forming the base layer during operation 306, method 300 may proceed with forming a resistive switching layer from the base layer during optional operation 308. In some embodiments, the base layer already includes all required nitrogen and operation 308 is skipped.

Otherwise, operation 308 may be used to introduce nitrogen into the base layer to convert this layer into a resistive switching layer. It should be noted that the resistive switching layer may be further processed to create initial conductive filaments by applying a formation voltage. Furthermore, the resistive switching layer may be subjected to annealing to more distribute evenly distribute material in the resistive switching layer, e.g., at 750° C. for 1 minutes in a forming gas.

Operation 308 may involve various nitridation techniques such as plasma nitridation (e.g., de-coupled plasma nitridation) and thermal nitridation (e.g., anneal). In plasma nitridation, the reactivity of the nitriding media is due to the ionized state of the gas. Electric fields are used to generate ionized species of the gas (e.g., molecular nitrogen) around the processed surface. The ionized species react with materials in the base layer, which cause introduction of nitrogen into the layer. Thermal nitridation may use a nitrogen rich reactive gas, such as ammonia ($NH_3$). When the gas comes into contact with the surface of the heated base layer, the gas disassociates releasing nitrogen (and hydrogen if ammonia is used). This nitrogen then diffuses into the layer. These processes may be specifically controlled to achieve specific concentrations and distributions of nitrogen in the resistive switching layer. Plasma nitridation may used in some embodiments. In some embodiments, various metal nitrides deposited using ALD techniques can be converted into oxynitrides (partially oxidized) after being annealed for 1 min in oxygen containing environment at high temperatures (e.g., 400° C.-700° C.). At 750° C., the oxygen anneal may complete convert the nitride into oxide and therefore, the temperature or oxygen concentration should be limited.

Once the resistive switching layer is formed, the process may proceed with forming of a top electrode during operation 310. The top electrode may also be deposited in a manner similar to the bottom electrode as described above with reference to operation 304. Other layers, such as interface or capping layers, current limiting layers, and other layer may be deposited in the stack, e.g., between the top electrode and the resistive switching layer and/or between the bottom electrode and the resistive switching layer.

ReRAM Cell Examples

Figure 4:
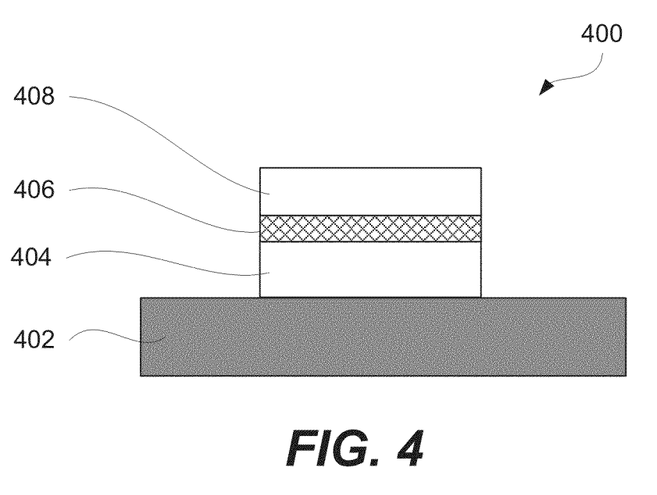
FIG. 4 illustrates a schematic representation of a ReRAM cell, in accordance with some embodiments.

FIG. 4 illustrates a schematic representation of resistive switching ReRAM cell 400, in accordance with some embodiments. Resistive switching ReRAM cell 400 includes substrate 402, which may include a signal line. Alternatively, bottom electrode 404 may serve as a signal line. Substrate 402 provides a surface for deposition of bottom electrode 404. Bottom electrode 404 is disposed between substrate 402 and resistive switching layer 406. Top electrode 408 is provided above resistive switching layer 406.

Resistive switching layer 406 includes hafnium, aluminum, oxygen, and nitrogen. It should be noted that resistive switching layer 406 may include any concentrations of these four elements and are not limited by any stoichiometric ratios. In some embodiments, the concentration of nitrogen in the switching layer is between about 1 and 20 atomic percent or, more specifically, between about 2 and 5 atomic percent. The concentration of nitrogen in the resistive switching layer may be at least three times less than the concentration of oxygen. In some embodiments, the concentration of oxygen in the resistive switching layer is between about 30 and 60 atomic percent or, more specifically between about 40 and 50 atomic percent.

In some embodiments, nitrogen is unevenly distributed within resistive switching layer 406. For example, more nitrogen may be present at the interface with top electrode 408 or bottom electrode 404. Specifically, resistive switching layer 406 may include a sub-layer at the interface with one of these electrodes such that more than 50 atomic percent or more than 75 atomic percent or even more than 90 atomic percent of all nitrogen present in resistive switching layer 406 is provided within this sublayer. In some embodiments, the thickness of this sublayer is one tenth of the thickness of resistive switching layer 406.

In some embodiments, the concentration of hafnium in the resistive switching layer is between about 5 and 40 atomic percent or, more specifically, between about 10 and 30 atomic percent. The concentration of aluminum in the resistive switching layer is between 3 and 20 atomic percent or, more specifically, between about 5 and 10 atomic percent. In some embodiments, the concentration of hafnium in the resistive switching layer is at least twice greater than the concentration of aluminum.

The material of resistive switching layer 406 is substantially amorphous after formation of this layer. In some embodiments, resistive switching layer 406 remains substantially amorphous after further processing of the layer, such as annealing, applying a formation voltage, and other operations. Furthermore, in some embodiments, resistive switching layer 406 remains substantially amorphous during operation of ReRAM cell, i.e., applying switching voltages and reading voltages that drive corresponding currents.

In some embodiments, the thickness of restive switching layer 406 is between about 20 and 100 Angstroms or, more specifically, between about 40 and 70 Angstroms, for example, about 50 Angstroms. The thickness of top and bottom electrodes 404 and 408 may be at least about 30 and 1000 Angstroms or, more specifically, between about 100 and 500 Angstroms. In some embodiments, the thickness of one or both electrodes is less than 50 Angstroms. Such electrodes may be deposited using ALD techniques.

Electrodes 404 and 408 provide electronic communication to resistive switching layer 406 of ReRAM cell 400. One or both electrodes may directly interface resistive switching layer 406 or be spaced apart by other layers, such as barrier layers, current limiting layer, and the like. Depending on the materials used for electrode construction, the electrode (e.g., an electrode formed from titanium nitride) itself may also serve as an adhesion layer and/or barrier layer. In some embodiments, one or both electrodes are also function as signal lines (i.e., bit and/or word lines) and are shared by other ReRAM cells.

Some examples of electrode materials include silicon (e.g., n-doped poly-silicon and p-doped poly-silicon), silicides, silicide-germanides, germanides, titanium, titanium nitride (TiN), platinum, iridium, iridium oxide, ruthenium, ruthenium oxide, and the like. Generally, any sufficiently conductive material may be used to form an electrode. In some embodiments, barrier layers, adhesion layers, antireflection coatings and/or the like may be used with the electrodes and to improve device performance and/or aid in device fabrication.

In some embodiments, one electrode may be a higher work function material, and the other electrode may be a lower work function material than the resistive switching layer. For example, a noble or near noble metal (i.e., a metal with a low absolute value free energy change ($|\Delta G|$) of oxide formation) may be used for one electrode. Specific examples include iridium, iridium oxide, platinum, ruthenium, and ruthenium oxide. The other electrode may be a lower work function material, such as titanium nitride. In some embodiments, the reset pulse at the electrode having the higher work function may be a positive pulse.

In some embodiments, one or both electrodes may be multi-layer electrodes formed by one or more different materials. For example, an electrode can include a base layer and capping layer. The base layer may include ruthenium, ruthenium oxide, iridium, iridium oxide, platinum, and various combinations thereof. The capping layer may include tungsten, tungsten carbonitride, and/or tungsten carbon. The multi-layer electrodes can be used to improve adhesion properties and performance of memory elements in some configurations and embodiments.

ReRAM cell 400 may include another layer (not shown) that is operable as a current limiting layer. A material for this layer may have a suitable work function for controlling the electron flow through ReRAM cell. This specific selection may alter the magnitude of the generated switching currents. In some embodiments, the current limiting layer is used to increase or decrease the formed barrier height at the interface with resistive switching layer 406. This feature is used to improve current flowing characteristics and reduce the magnitude of the switching currents. It should be noted that these changes in the barrier height will generally not affect the current ratio ($I_{ON}/I_{OFF}$), and thus not impacts detectability of different resistive states.

In some embodiments, the current limiting layer is between about 50 Angstroms and 1000 Angstroms thick, such as between about 200 Angstroms and 50 Angstroms. This layer may be formed from a material that has a resistivity of between about 5 Ohm-cm and 500 Ohm-cm, such as between about 50 Ohm-cm and 150 Ohm-cm. In some embodiments, the current limiting layer is formed such that its resistance ($R_{RL}$) is between about 10 kilo-Ohm and about 10 mega-Ohm, such as between about 100 kilo-Ohm and about 1 mega-Ohm.

Resistivity is an intrinsic property of the material and can be controlled by adjusting the composition of the material. Some specific examples, include adding alloying elements or doping atoms and/or adjusting the morphological structure of the materials, (e.g., shifting from amorphous to crystal structure). In some embodiments, a current limiting layer may include titanium oxide doped with niobium, tin oxide doped with antimony, or zinc oxide doped with aluminum. The concentration of dopant materials in the base material may be between about 0.5 and 25 atomic % or, more specifically, between about 1 and 10 atomic %.

Other examples of materials suitable for the current limiting layer include titanium nitride ($Ti_xN_y$), tantalum nitride ($Ta_xN_y$), silicon nitride ($Si_xN_y$), hafnium nitride ($Hf_xN_y$) or titanium aluminum nitride ($Ti_xAl_yN_z$) layer. Such layers may be formed using an ALD, CVD or PVD process as further described below.

Apparatus Examples

Figure 5:
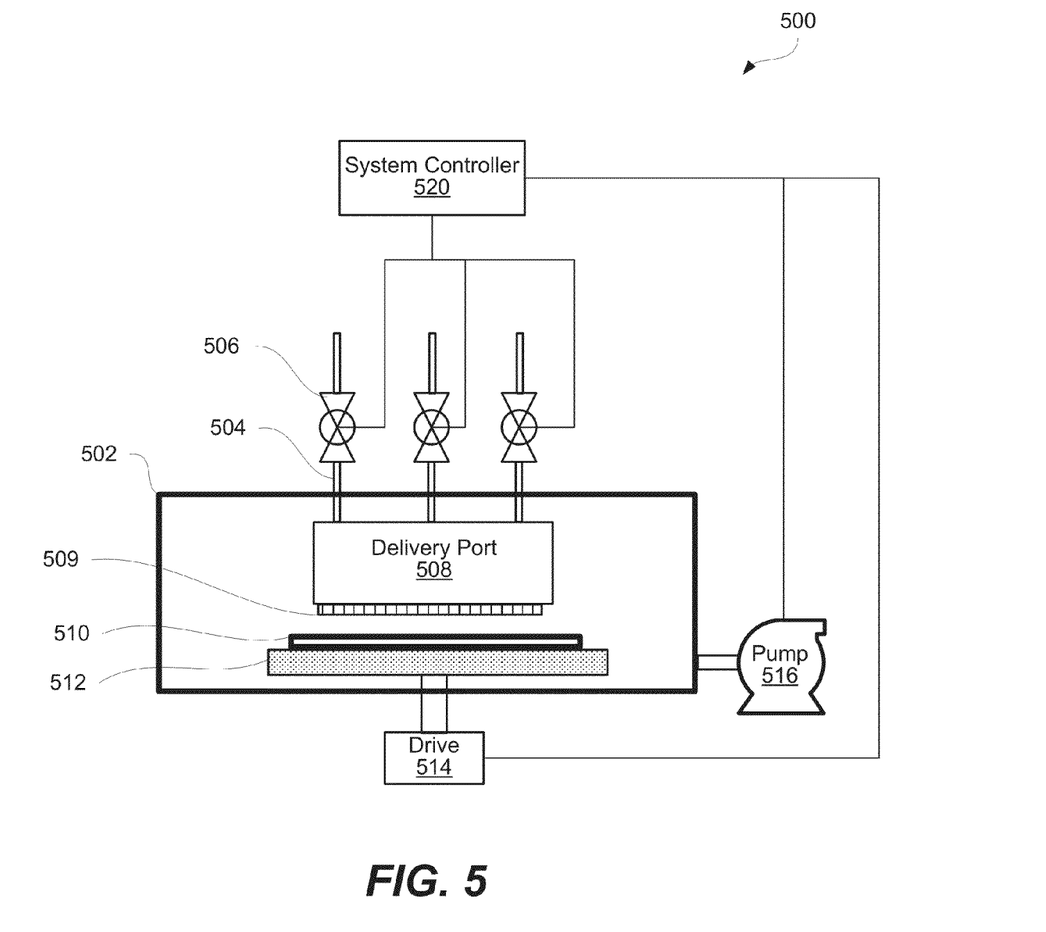
FIG. 5 illustrates a schematic representation of an atomic layer deposition apparatus for fabricating ReRAM cells, in accordance with some embodiments.

FIG. 5 illustrates a schematic representation of atomic layer deposition apparatus 500 for fabricating ReRAM cells, in accordance with some embodiments. For clarity, some components of apparatus 500 are not included in this figure, such as a wafer-loading port, wafer lift pins, and electrical feed throughs. Apparatus 500 includes deposition chamber 502 connected to processing gas delivery lines 504. While FIG. 5 illustrates three delivery lines 504, any number of delivery lines may be used. Each line may be equipped with a valve and/or mass flow controller 506 for controlling the delivery rates of processing gases into deposition chamber 502. In some embodiments, gases are provided into delivery port 508 prior to exposing substrate 510 to processing gases. Deliver port 508 may be used for premixing gases (e.g., precursors and diluents) and even distribution of gases over the surface of substrate 510. Delivery port 508 is sometimes referred to as a showerhead. Delivery port 508 may include a diffusion plate 509 having with multiple holes for gas distribution.

Deposition chamber 502 encloses substrate support 512 for holding substrate 510 during its processing. Substrate support 512 may be made from a thermally conducting metal (e.g., W, Mo, Al, Ni) or other like materials (e.g., a conductive ceramic) and may be used to maintain the substrate temperature at desired levels. Substrate support 512 may be connected to drive 514 for moving substrate 510 during loading, unloading, process set up, and sometimes even during processing. Deposition chamber 502 may be connected to vacuum pump 516 for evacuating reaction products and unreacted gases from deposition chamber 502 and for maintaining the desirable pressure inside chamber 502.

Apparatus 500 may include system controller 520 for controlling process conditions during electrode and resistive switching layer deposition and other processes. Controller 520 may include one or more memory devices and one or more processors with a CPU or computer, analog and/or digital input/output connections, stepper motor controller boards, etc. In some embodiments, controller 520 executes system control software including sets of instructions for controlling timing, gas flows, chamber pressure, chamber temperature, substrate temperature, RF power levels (if RF components are used, e.g., for process gas dissociation), and other parameters. Other computer programs and instruction stored on memory devices associated with controller may be employed in some embodiments.

Memory Array Examples

Figure 6A:
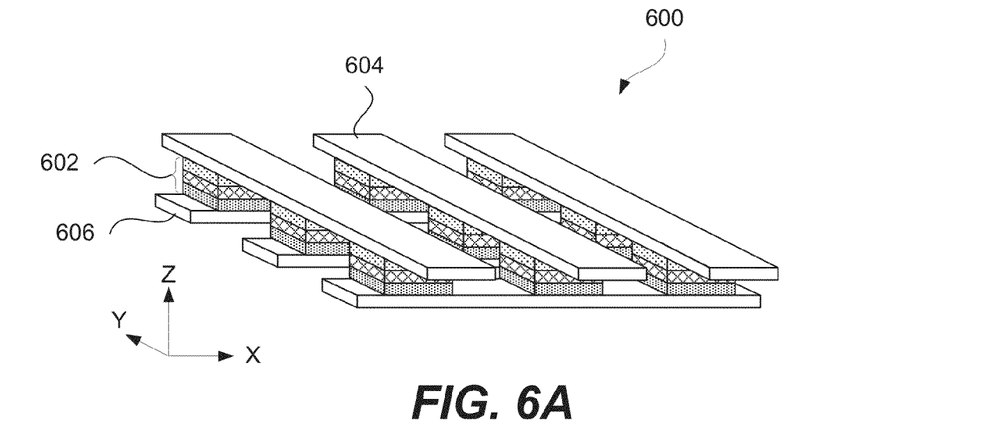
FIGS. 6A and 6B illustrate schematic views of memory arrays including multiple ReRAM cells, in accordance with some embodiments.

A brief description of memory arrays will now be described with reference to FIGS. 6A and 6B to provide better understanding to various aspects of thermally isolating structures provided adjacent to ReRAM cells and, in some examples, surrounding the ReRAM cells. ReRAM cells described above may be used in memory devices or larger integrated circuits (IC) that may take a form of arrays. FIG. 6A illustrates a memory array 600 including nine ReRAM cells 602, in accordance with some embodiments. In general, any number of ReRAM cells may be arranged into one array. Connections to each ReRAM cell 602 are provided by signal lines 604 and 606, which may be arranged orthogonally to each other. ReRAM cells 602 are positioned at crossings of signal lines 604 and 606 that typically define boundaries of each ReRAM cell in array 600.

Signal lines 604 and 606 are sometimes referred to as word lines and bit lines. These lines are used to read and write data into each ReRAM cell 602 of array 600 by individually connecting ReRAM cells to read and write controllers. Individual ReRAM cells 602 or groups of ReRAM cells 602 can be addressed by using appropriate sets of signal lines 604 and 606. Each ReRAM cell 602 typically includes multiple layers, such as top and bottom electrodes, resistive switching layer, embedded resistors, embedded current steering elements, and the like, some of which are further described elsewhere in this document. In some embodiments, a ReRAM cell includes multiple resistive switching layers provided in between a crossing pair of signal lines 604 and 606.

As stated above, various read and write controllers may be used to control operations of ReRAM cells 602. A suitable controller is connected to ReRAM cells 602 by signal lines 604 and 606 and may be a part of the same memory device and circuitry. In some embodiments, a read and write controller is a separate memory device capable of controlling multiple memory devices each one containing an array of ReRAM cells. Any suitable read and write controller and array layout scheme may be used to construct a memory device from multiple ReRAM cells. In some embodiments, other electrical components may be associated with the overall array 600 or each ReRAM cell 602. For example, to avoid the parasitic-path-problem, i.e., signal bypasses by ReRAM cells in their low resistance state (LRS), serial elements with a particular non-linearity must be added at each node or, more specifically, into each element. Depending on the switching scheme of the ReRAM cell, these elements can be diodes or varistor-type elements with a specific degree of non-linearity. In the same other embodiments, an array is organized as an active matrix, in which a transistor is positioned at each node or, more specifically, embedded into each cell to decouple the cell if it is not addressed. This approach significantly reduces crosstalk in the matrix of the memory device.

Figure 6B:
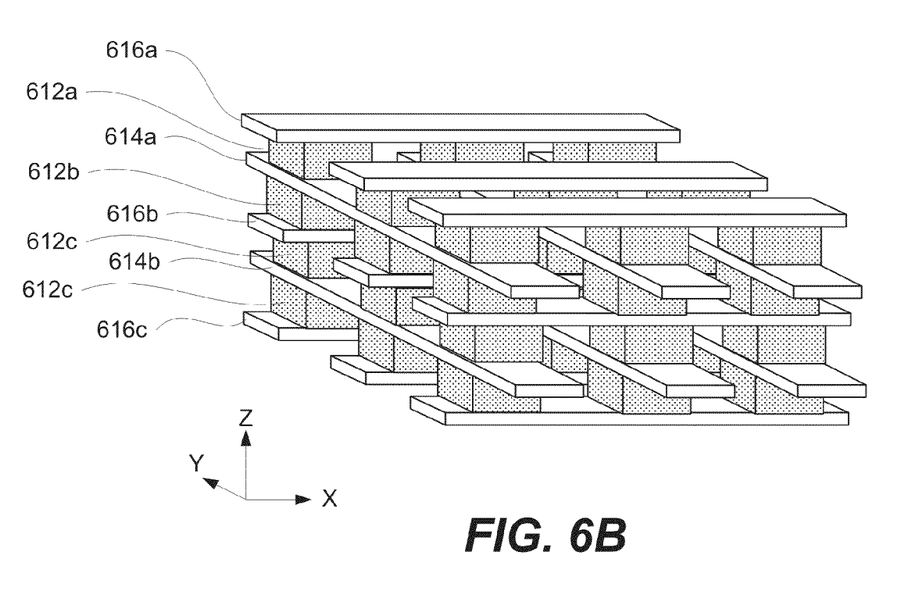

In some embodiments, a memory device may include multiple array layers as, for example, illustrated in FIG. 6B. In this example, five sets of signal lines 614a-b and 616a-c are shared by four ReRAM arrays 612a-c. As with the previous example, each ReRAM array is supported by two sets of signal lines, e.g., array 612a is supported by 614a and 616a. However, middle signal lines 614a-b and 616b, each is shared by two sets ReRAM arrays. For example, signal line set 614a provides connections to arrays 612a and 612b. Top and bottom sets of signal lines 616a and 616c are only used for making electrical connections to one array. This 3-D arrangement of the memory device should be distinguished from various 3-D arrangements in each individual ReRAM cell.

Conclusion

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A resistive random access memory cell comprising:
   a first layer operable as a first electrode;
   a second layer operable as a second electrode; and
   a third layer operable as a resistive switching layer and disposed between the first layer and the second layer,
      wherein the third layer is operable to repeatedly switch between a first resistive state and a second resistive state when switching voltages are applied between the first layer and the second layer,
      the third layer comprising a single material including hafnium, aluminum, oxygen, and nitrogen,
      wherein a thickness of the third layer is between 20 and 100 Angstroms.

2. The resistive random access memory cell of claim 1, wherein a concentration of oxygen in the third layer is between 30 and 60 atomic percent.

3. The resistive random access memory cell of claim 1, wherein a concentration of nitrogen in the third layer is between 1 and 20 atomic percent.

4. The resistive random access memory cell of claim 1, wherein a concentration of nitrogen in the third layer is at least three times less than a concentration of oxygen.

5. The resistive random access memory cell of claim 1, wherein a concentration of hafnium in the third layer is at least twice greater than a concentration of aluminum.

6. The resistive random access memory cell of claim 1, wherein a concentration of hafnium in the third layer is between 5 and 40 atomic percent.

7. The resistive random access memory cell of claim 1, wherein a concentration of aluminum in the third layer is between 3 and 20 atomic percent.

8. The resistive random access memory cell of claim 1, wherein the third layer is substantially amorphous.

9. The resistive random access memory cell of claim 1, wherein the nitrogen is unevenly distributed within the third layer.

10. The resistive random access memory cell of claim 1, wherein the first layer directly interfaces the third layer.

11. The resistive random access memory cell of claim 10, wherein the first layer comprises one of tantalum nitride, titanium nitride, or tungsten nitride.

12. The resistive random access memory cell of claim 1, wherein the first layer or the second layer has a thickness of less than 50 Angstroms.

13. The resistive random access memory cell of claim 1, wherein a portion of the third layer comprises more than 50 atomic percent of all nitrogen presented in the third layer, and wherein a thickness of the portion is one tenth of a thickness of the third layer.

14. The resistive random access memory cell of claim 13, wherein the portion of the third layer comprises more than 75 atomic percent of all nitrogen presented in the third layer.

15. The resistive random access memory cell of claim 13, wherein the portion of the third layer comprises more than 90 atomic percent of all nitrogen presented in the third layer.

16. The resistive random access memory cell of claim 13, wherein the portion of the third layer interfaces with the first layer.

17. The resistive random access memory cell of claim 10, wherein the first layer comprises titanium nitride.

18. The resistive random access memory cell of claim 17, wherein the second layer comprises doped polysilicon.

19. The resistive random access memory cell of claim 1, wherein the first electrode comprises a first portion comprising one of ruthenium, ruthenium oxide, iridium, iridium oxide, or platinum and a second portion comprising one of tungsten, tungsten carbonitride, or tungsten carbon.

20. The resistive random access memory cell of claim 1, wherein each of hafnium, aluminum, oxygen, and nitrogen is distributed evenly within the third layer.

* * * * *